United States Patent
Madurawe et al.

(10) Patent No.: US 6,972,234 B1
(45) Date of Patent: Dec. 6, 2005

(54) HIGH VOLTAGE MOS DEVICES WITH HIGH GATED-DIODE BREAKDOWN VOLTAGE AND PUNCH-THROUGH VOLTAGE

(75) Inventors: Raminda U. Madurawe, Sunnyvale, CA (US); David K. Y. Liu, Fremont, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/606,252

(22) Filed: Jun. 28, 2000

Related U.S. Application Data

(62) Division of application No. 08/920,377, filed on Aug. 29, 1997, now Pat. No. 6,417,550.

(60) Provisional application No. 60/024,927, filed on Aug. 30, 1996, provisional application No. 60/025,843, filed on Sep. 6, 1996.

(51) Int. Cl.$^7$ .......................................... H01L 21/336
(52) U.S. Cl. ........................ 438/289; 438/291; 438/527
(58) Field of Search .............................. 438/289, 291, 438/298, 306, 302, 519, 521, 526, 527

(56) References Cited

U.S. PATENT DOCUMENTS

| | | | |
|---|---|---|---|
| 4,173,818 A * | 11/1979 | Bassous et al. | 438/286 |
| 4,599,118 A | 7/1986 | Han et al. | |
| 4,714,519 A | 12/1987 | Pfiester | 437/81 |
| 4,737,471 A * | 4/1988 | Shirato et al. | 438/289 |
| 4,818,716 A | 4/1989 | Okuyama et al. | 437/49 |
| 4,948,745 A | 8/1990 | Pfiester et al. | |
| 5,134,085 A * | 7/1992 | Gilgen et al. | 438/210 |
| 5,162,884 A | 11/1992 | Liou et al. | 257/384 |
| 5,210,437 A | 5/1993 | Sawada et al. | |
| 5,248,624 A * | 9/1993 | Icel et al. | 438/201 |
| 5,266,508 A | 11/1993 | Azuma et al. | |
| 5,278,078 A | 1/1994 | Kanebako et al. | 437/29 |
| 5,384,279 A * | 1/1995 | Stolmeijer et al. | 438/217 |
| 5,449,937 A * | 9/1995 | Arimura et al. | 257/345 |
| 5,466,957 A * | 11/1995 | Yuki et al. | 257/344 |
| 5,472,897 A | 12/1995 | Hsu et al. | |
| 5,492,847 A | 2/1996 | Kao et al. | 437/44 |
| 5,538,913 A | 7/1996 | Hong | 437/49 |
| 5,548,143 A | 8/1996 | Lee | 257/269 |
| 5,552,332 A | 9/1996 | Tseng et al. | 437/41 |
| 5,583,067 A * | 12/1996 | Sanchez | 438/289 |
| 5,593,907 A * | 1/1997 | Anjum et al. | 438/298 |
| 5,668,021 A | 9/1997 | Subramanian et al. | 438/282 |
| 5,686,321 A | 11/1997 | Ko et al. | 437/44 |
| 5,721,443 A | 2/1998 | Wu | 257/344 |
| 5,757,045 A | 5/1998 | Tsai et al. | 257/336 |
| 5,763,921 A * | 6/1998 | Okumura et al. | 257/371 |
| 5,792,699 A | 8/1998 | Tsui | 438/290 |
| 5,936,278 A * | 8/1999 | Hu et al. | 257/336 |
| 6,080,630 A | 6/2000 | Milic-Strkalj et al. | |

* cited by examiner

*Primary Examiner*—Tom Thomas
*Assistant Examiner*—N. Drew Richards
(74) *Attorney, Agent, or Firm*—Townsend and Townsend and Crew, LLP

(57) ABSTRACT

A method of fabricating CMOS devices suitable for high voltage and low voltage applications, while maintaining minimum channel lengths for the devices. In one embodiment, pocket implants (310) are formed in a minimum channel device causing a reverse channel effect. The reverse channel effect is optimized for the minimum channel length of the device. Field implants (120), enhancement implants (130), and wells (140) are all formed using a single mask.

20 Claims, 10 Drawing Sheets

HIGH VOLTAGE MOS DEVICES WITH HIGH GATED-DIODE BREAKDOWN VOLTAGE AND PUNCH-THROUGH VOLTAGE

CROSS-REFERENCE TO RELATED APPLICATIONS

This application is a division of and claims the benefit of U.S. application Ser. No. 08/920,377, filed Aug. 29, 1997, now U.S. Pat. No. 6,417,550, which claims the benefit of Provisional Patent Application Ser. No. 60/024,927, filed Aug. 30, 1996, and Provisional Patent Application Ser. No. 60/025,843 filed Sep. 6, 1996, all of which are incorporated herein by reference for all purposes.

BACKGROUND OF THE INVENTION

The present invention relates to integrated circuits, and more particularly to high voltage CMOS transistors.

A general trend in CMOS logic is to provide smaller transistors with minimum feature sizes and lower power supply voltages. This scaling of CMOS transistors allows for the incorporation of more devices onto the same area of silicon. It also allows for lower power operations and greater reliability because the electric field is reduced. As the power supply voltage is scaled down, peripheral requirements of the transistors such as field isolation, junction breakdown voltages, and punch-through voltages are also reduced.

However, some CMOS technologies, particularly those involving nonvolatile memory such as EEPROM, EPROM, Flash, antifuse technologies, and the like, require the use of high voltages internally. For example, some programmable logic devices (PLDs) include nonvolatile memories that use high voltages for programming and erasing the memories. Altera Corporation in San Jose, Calif. produces some exemplary PLDs with this characteristic.

Typically, these devices use high voltages ranging from about 9 volts to about 16 volts. These high voltages are used for programming and erasing the programmable memory cells. High voltages may also be used to improve the performance of the speed path of the integrated circuit. The high voltage requirements of these technologies do not scale as easily as their counterparts in logic CMOS technology. For example, some of these technologies use the same 9 to 16 volt range of high voltage to program and erase memory cells, even if the supply voltage is scaled down. Therefore, the requirements for high junction breakdown voltages, high transistor punch-through voltages, and high field isolation voltages continue to exist even when the transistor feature sizes are reduced.

In mixed-mode applications logic CMOS devices are integrated with nonvolatile CMOS memory devices. In these applications, simultaneous high voltage and low voltage requirements exist. These simultaneous requirements are often contradictory. For example, high voltage transistors with high junction breakdown characteristics and high punch-through characteristics are needed to pass the high voltage. At the same time, in order to efficiently pass the high voltage from source and drain, without significant voltage drop, the transistor should have low channel doping to minimize the so-called body effect. In previous generations of technology using looser design rules, these contradictory high voltage requirements were met using long channel length transistors. However, as the technology is scaled down to 0.35 $\mu$m effective channel length ($L_{eff}$) and beyond, the cost and difficulty of integrating these high voltage transistors is increased.

As can be seen, there is a need for high voltage tolerant transistors and devices, especially for use in integrated circuits where high voltages are used internally.

SUMMARY OF THE INVENTION

It is desirable to provide a technique for obtaining a set of minimum channel length transistors in a CMOS technology for both high and low voltage use. The native high voltage transistors in the set should preferably maintain high punch-through characteristics. Preferably, the transistors in the set will have the same minimum channel length. Designing all the transistors in the set to the same minimum channel length allows the design rules to be simpler, provides matching devices, simplifies the modeling of the transistors, and allows layout in a smaller area than long channel devices. It is desirable that such technologies be useful for 0.35 $\mu$m effective channel length process technology and beyond. Further, the techniques to obtain these devices are preferably implemented without using any additional masks.

Consequently, the present invention provides an improved transistor for an integrated circuit. The transistor comprises source and drain regions in a substrate defining a channel region between them. The source and drain regions are separated by a channel length. A plurality of pocket implants, also known as "halo implants," extend into the channel region between the source region and the drain region to cause a reverse short channel effect for the transistor.

The present invention also provides a method of fabricating an integrated circuit comprising the steps of
depositing a field implant, depositing a well implant, and depositing an enhancement implant, wherein the steps of depositing a field implant, depositing a well implant, and depositing an enhancement implant are done using a single mask.

A further understanding of the nature and advantages of the inventions herein may be realized by reference to the remaining portions of the specification and the attached drawings.

DETAILED DESCRIPTION OF THE SPECIFIC EMBODIMENT

Figure 1A:
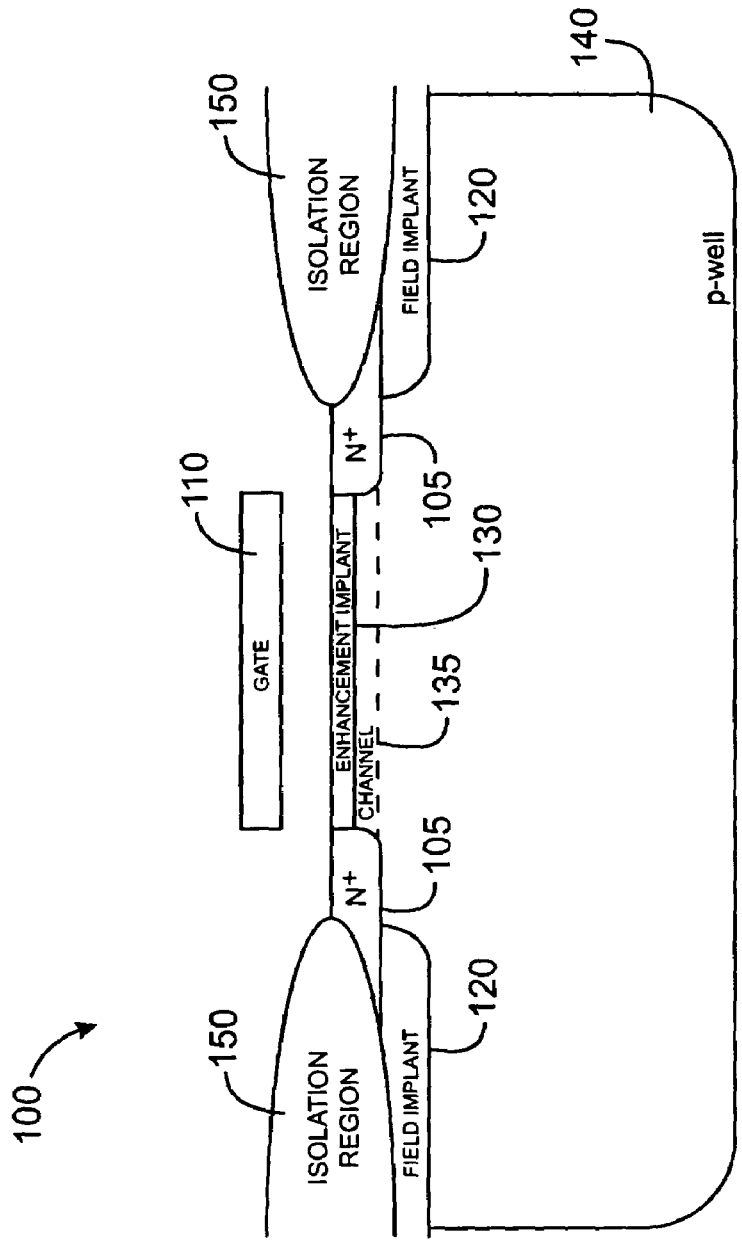
FIG. 1A shows a cross-section of a low voltage NMOS transistor.

FIG. 1A shows a cross-section of a low voltage NMOS transistor 100. This transistor would be used in the implementation of typical logic gates on an integrated circuit. Transistor 100 has source/drain regions 105 made of n+ material and a polysilicon gate region 110. Operation of such a device is well known to those of skill in the art. Transistor 100 includes field implants 120 adjacent to the edge of each source-drain region 105. In addition, an enhancement implant 130 is formed in a channel region 135 of the transistor. Enhancement implant 130 is located close to the surface of the substrate and is used to adjust the magnitude of the threshold voltage $V_t$ of the transistor to be about 0.50 volts to 0.70 volts. The transistor also has a well implant 140 of p-type material to control the body doping concentration of the device. An isolation region 150 electrically isolates individual devices from one another.

Figure 1B:
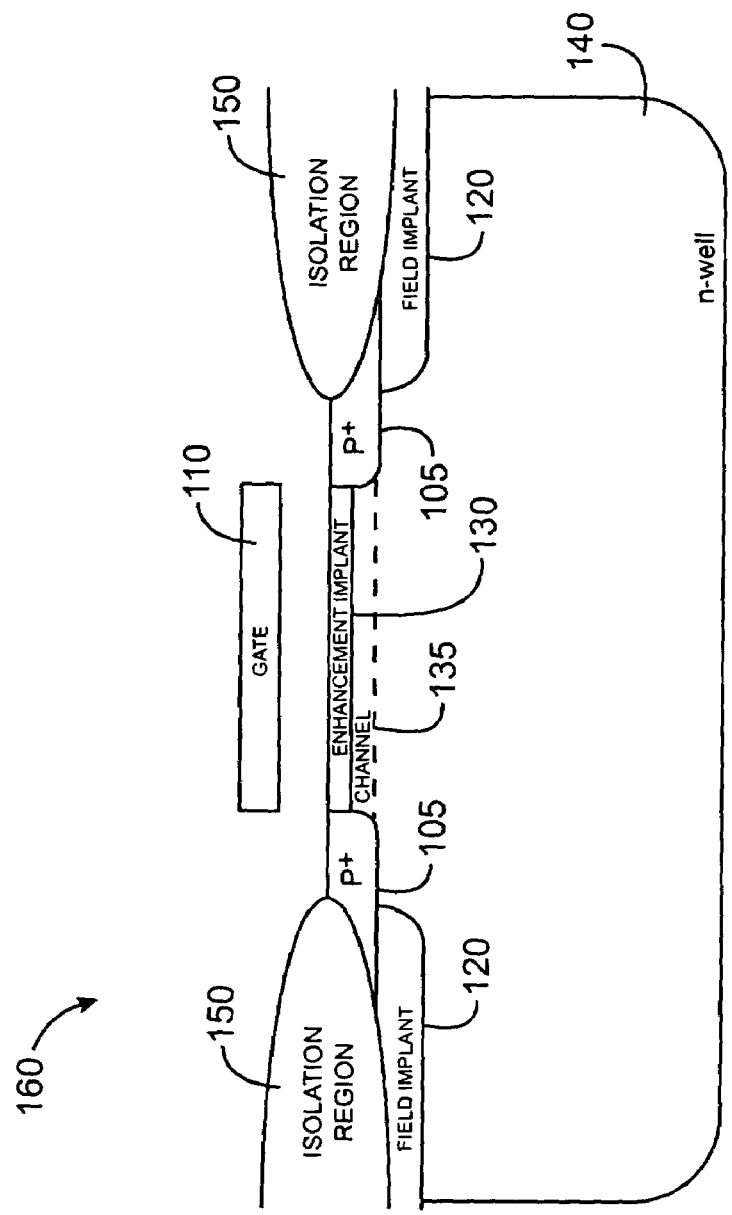
FIG. 1B shows a cross-section of a low voltage PMOS transistor.

FIG. 1B shows a cross-section of a low voltage PMOS transistor 160. Source/drain regions 105 are implanted or doped with p+ ions, and well implant 140 is of n-type material. As is well known to those of skill in the art, the operational physics of a PMOS transistor is the complement of that used to describe the operation of an NMOS transistor. It is understood that the principles of the present invention apply to both NMOS and PMOS type devices.

Typical enhancement transistors 100 and 160 may not be capable of handling the high voltages needed for some applications, such as interfacing with non-volatile memory cells. When the gate voltage on gate 110 is low (i.e., zero volts), the breakdown voltage of source/drain region 105 is limited by enhancement implant 130 and well implant 140. On the other hand, when the gate voltage on gate 110 is high, the breakdown voltage is limited by field implant 120. In addition, if transistors 100 and 160 are used as high voltage pass gates, the maximum amount of high voltage that can pass from drain to source is limited by the body effect due to enhancement implant 130 and the doping level of well implant 140. The doping level of well implant 140 can be adjusted to control the punch-through resistance and the latch-up immunity of transistors 100 and 160. Transistors 100 and 160 may be optimized by controlling the properties of well implant 140, enhancement implant 130, and field implant 120.

Figure 2A:
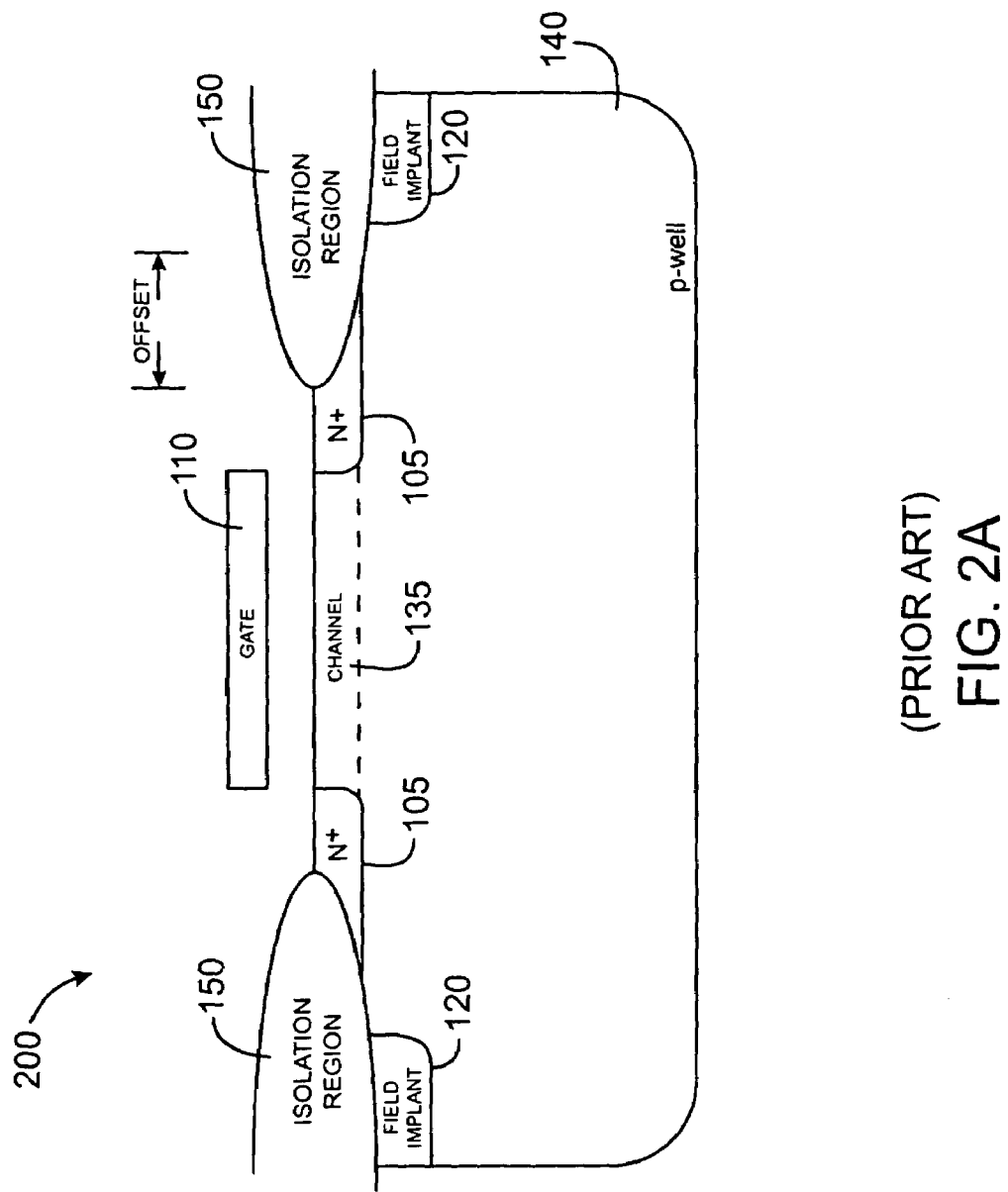
FIG. 2A shows a cross-section of a native NMOS transistor.
Figure 2B:
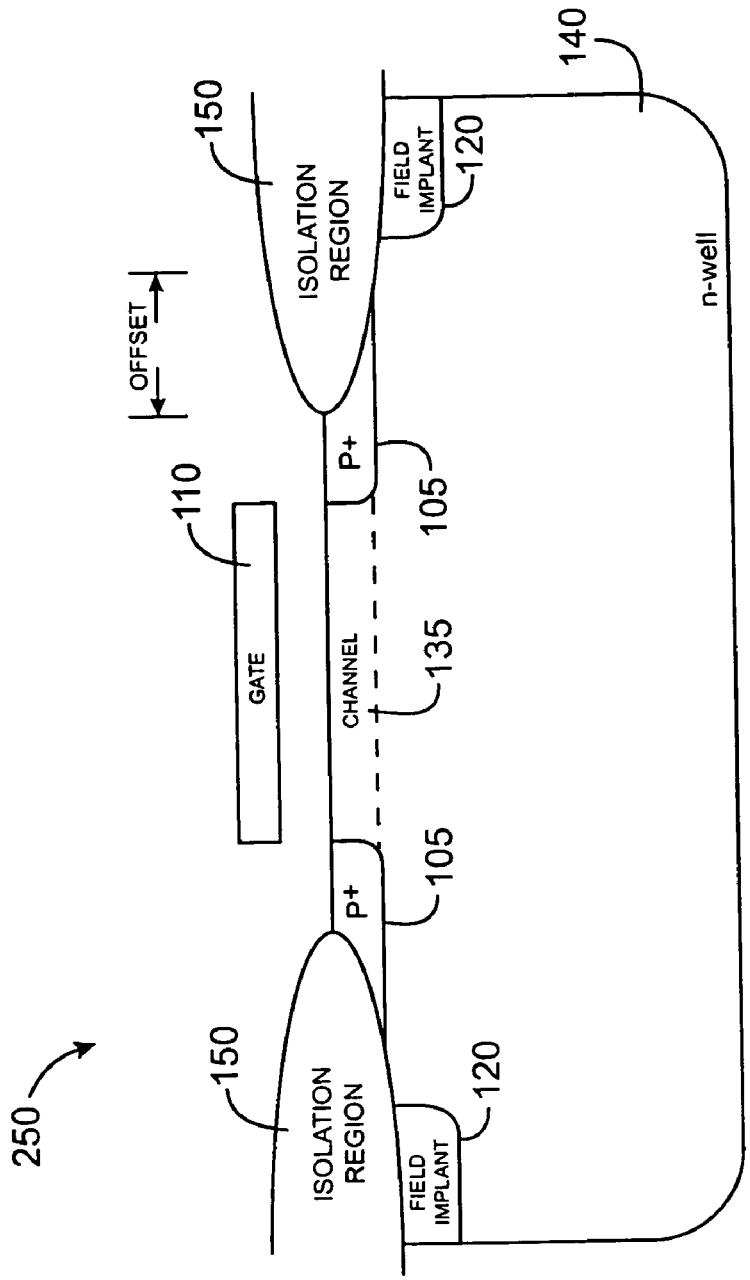
FIG. 2B shows a cross-section of a native PMOS transistor.

FIG. 2A shows a cross-section of a native NMOS transistor 200. FIG. 2B shows a cross-section of a native PMOS transistor 250. It will be recognized by one of skill in the art that the principles discussed in the present invention apply to both NMOS and PMOS transistors 200 and 250. For simplicity, the term transistor will be used to apply to both NMOS and PMOS transistors. In general, the term "native transistor" refers to a transistor is not implanted with the enhancement implant. The absence of the enhancement implant reduces the body effect of the transistor. This results in the native transistor having a low $V_t$, typically about 0 volts. The term "native translator" also refers to a low $V_t$ transistor (e.g., $V_t$ of about 0 volts to 0.2 volts) or a transistor with low channel doping.

Compared with a typical enhancement transistor 100, field implants 120 in native transistors 200 and 250 are offset from source/drain regions 105. This offset allows native transistors 200 and 250 to support a high drain breakdown voltage when the gate voltage on gate region 110 is high. The amount of offset between field implant 120 and the source/drain regions 105 determines the maximum drain breakdown voltage the device can support. When the offset is very large, the gated diode breakdown voltage of the junction approaches that of a pure junction. The reduction or elimination of enhancement implant 130 also increases the drain breakdown voltage at zero-volt bias on gate region 110.

It is desirable to provide a transistor that supports high drain breakdown voltage for any bias voltage on gate region 110. However, transistors 200 and 250 may not be practical for this purpose when the channel length is scaled down. This is due to the fact that transistor 200 is susceptible to source and drain punch-through as the voltage between source and drain increases. A partial solution to this is to use a longer channel length device. However, the use of a long channel device as technology is scaled down to 0.35 $\mu$m and beyond is costly due to the extra space required for layout. Furthermore, modeling may become more difficult since separate models need to be generated for the longer channel devices. In addition, native devices and transistors are available when separate $V_t$ implant and field implant masks are in the process flow for a technology. However, the trend of using retrograded wells, with implants through the field oxide, will not afford the separate masking steps necessary to provide for native devices as described.

Figure 3:
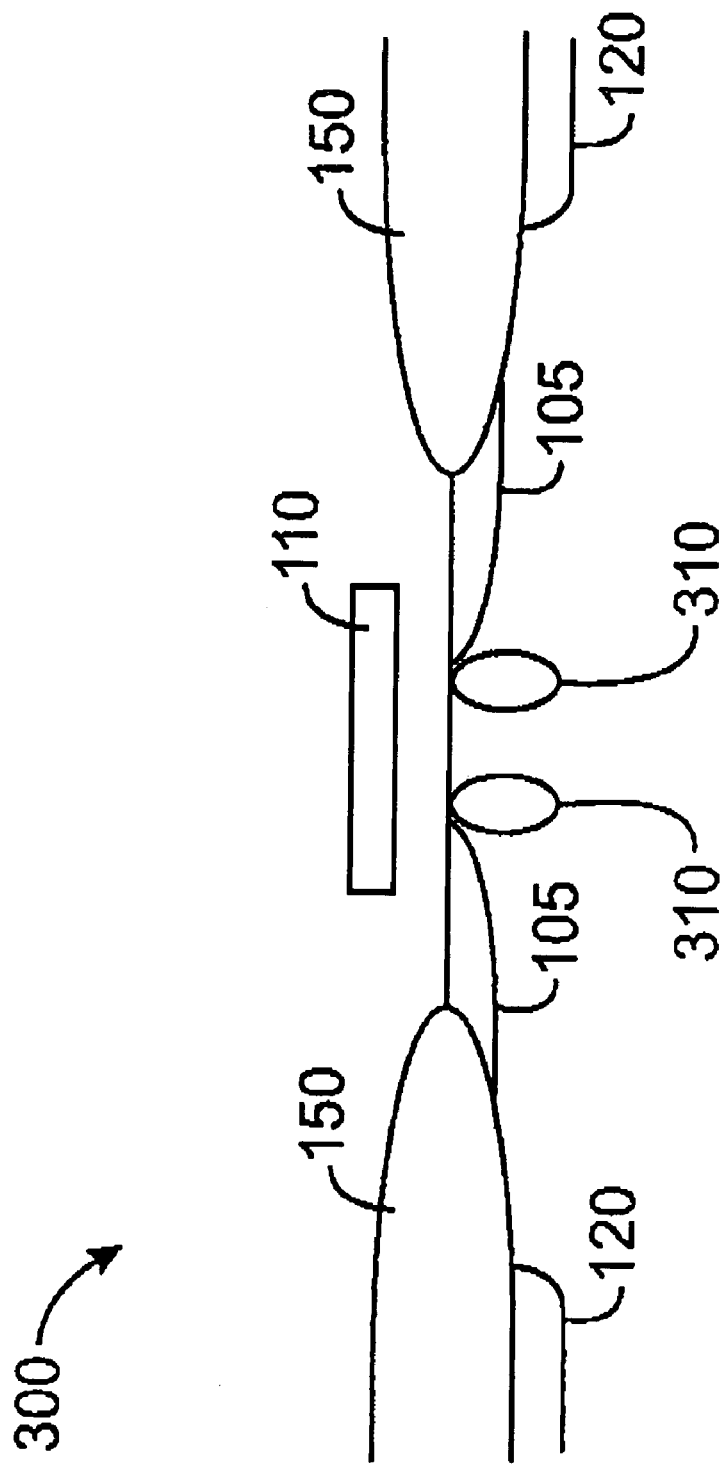
FIG. 3 shows a cross-section of a transistor with pocket implants.

FIG. 3 illustrates a cross-section of a transistor 300 with pocket implants. Pocket implants, also known as "halo implants," increase the punch-through voltage of a transistor (native or enhancement). Pocket implants may be formed of n-type material or p-type material. Typically, the pocket implant is of the opposite polarity from that of source/drain regions 105. Consequently, a PMOS transistor has n-type pocket implants, while an NMOS transistor has p-type pocket implants.

Transistor 300 is similar to native transistors 200 and 250 with the addition of two pocket implants 310. Pocket implants 310 may be implemented through large angle implantation. They surround the junctions of source/drain regions 105. Pocket implants 310 may be of n-type material or p-type material, depending upon whether transistor 300 is a PMOS or NMOS transistor, respectively.

Pocket implants 310 are optimized in conjunction with lightly doped drain (LDD) processing. Pocket implants 310 act to reduce the subthreshold leakage current in the transistor since they effectively increase the potential barrier height between source/drain regions 105 and channel region 135.

Figure 4:
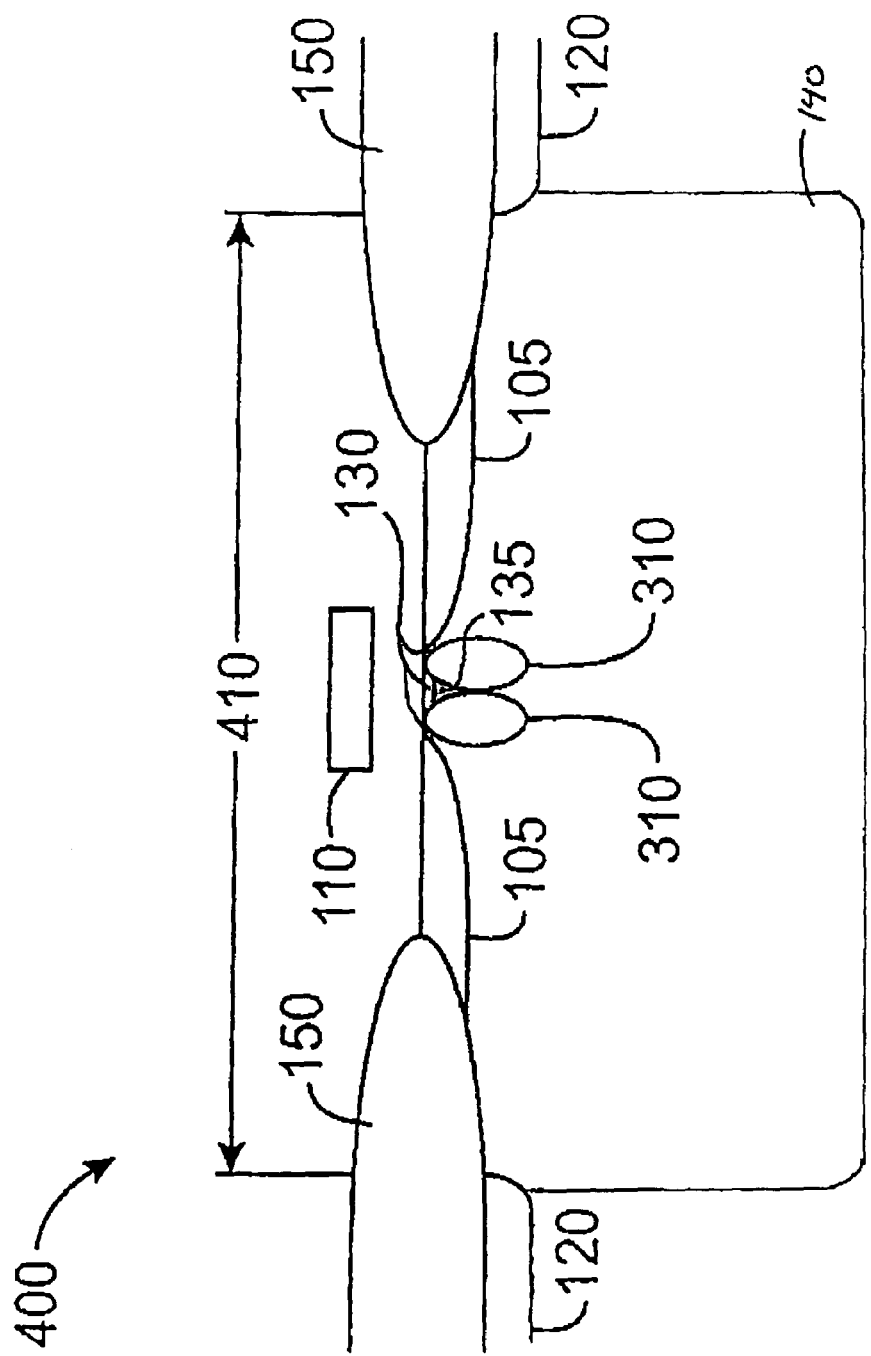
FIG. 4 shows a cross-section of a transistor with merged pocket implants.

FIG. 4 shows a cross-section of a high voltage transistor 400 formed by the technique of the present invention. Transistor 400 has gate region 110, and two source/drain regions 105 separated by a channel region 135. An isolation region 150 separates transistor 400 from other devices in the integrated circuit. Field implants 120 are offset from source/drain regions 105 as described above. Mask region 410 is the mask area defined for formation of well 140. Well 140, field implant 120, and enhancement region 130 (for enhancement transistors) can be formed by implanting at different energy levels, using only the mask defining mask region 410.

Transistor 400 also has two pocket implants 310 at the junctions between channel region 135 and source/drain regions 105. However, in contrast with transistor 300 of FIG. 3 which has a long channel, transistor 400 has a short channel. As the channel length of transistor 400 becomes shorter, pocket implants 310 begin to merge together. The merging of pocket implants 310 cause the threshold voltage $V_t$ of transistor 400 to change. For some short channel lengths, as pocket implants 310 merge, $V_t$ is increased. This effect is known as a "reverse short channel effect." This increase in $V_t$ increases the punch-through voltage over that of a long channel device.

Figure 5:
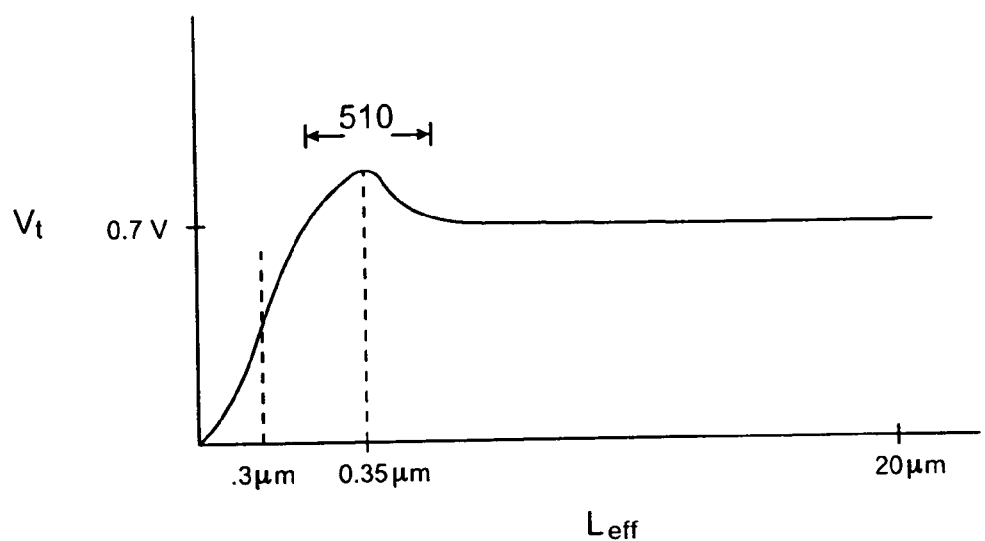
FIG. 5 is a graph of the channel doping characteristics of a typical transistor with pocket implants.

FIG. 5 is a graph showing the channel doping profile of transistor 400 and illustrates the reverse short channel effect. The graph plots the voltage threshold $V_t$ against the effective length $L_{eff}$ of channel region 135. As can be seen from the graph, at higher channel lengths, $V_t$ is relatively constant. However, as the channel length shortens and pocket implants 310 begin to merge, $V_t$ becomes higher for a short range before dropping off sharply. This area of higher $V_t$ is due to the reverse short channel effect, and is shown in FIG. 5 as region 510.

During the implantation of pocket implants 310, the amount of lateral diffusion can be adjusted to optimize the reverse short channel effect for the technology being used. In the specific embodiment, the channel length is 0.35 µm. As process technology improves, channel lengths will likely become less than 0.35 µm, such as 0.25 µm, 0.18 µm, 0.18 µm, 0.15 µm, 0.10 µm or even less. The principles of the present invention will be applicable in cases with shorter channel lengths. Therefore, in the specific embodiment, pocket implants 310 are optimized such that the apex in region 510 of the graph is at the 0.35 µm channel length. In technologies with different channel lengths, the pocket implants may be optimized accordingly.

Due to this reverse short channel effect, a configuration of two minimum channel length transistors (such as transistor 400) in series will offer a much improved punch-through immunity over a single transistor with twice the minimum channel length. This allows both low voltage transistors and high voltage native transistors to be designed with the same minimum geometry channel length for the given technology.

Figure 6:
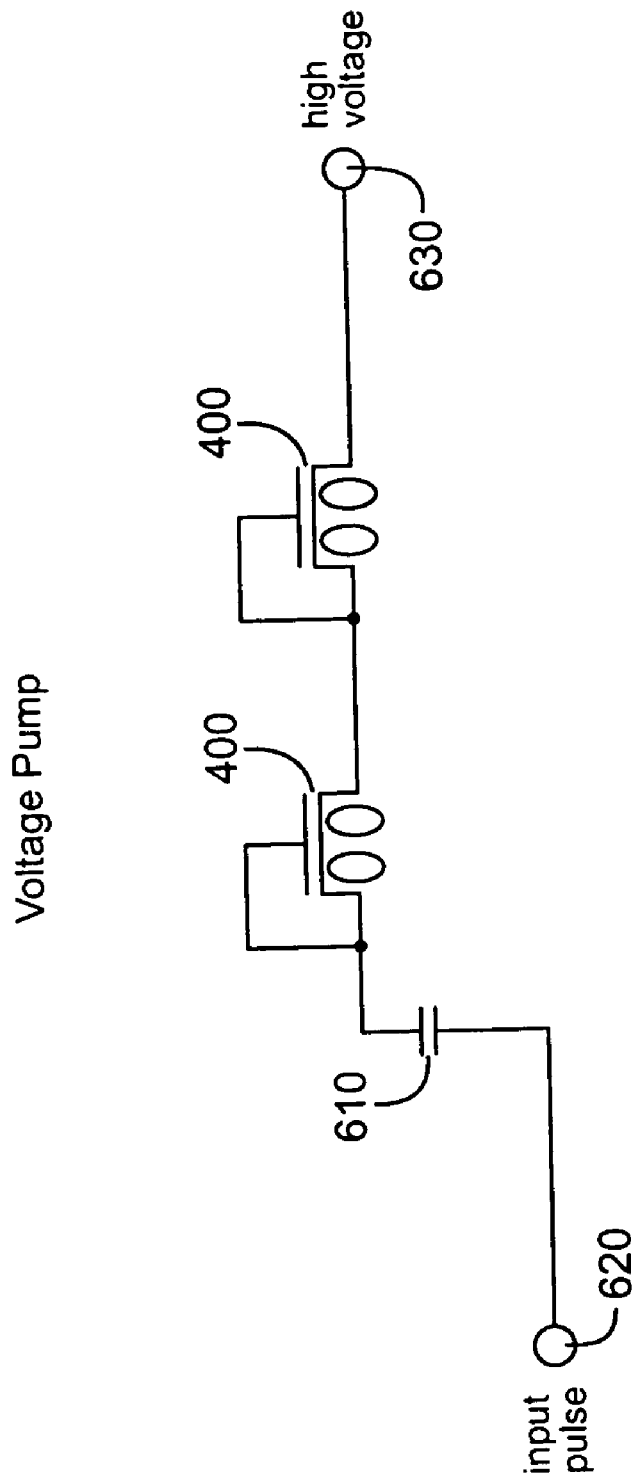
FIG. 6 is a diagram of circuitry for use in a voltage pump using transistors of the present invention.

An example of a use for transistor 400 is in the design of voltage pumps. A voltage pump should be able to pass high voltages, without high leakage current. If the leakage current is high, then the voltage pump will not be able to maintain the proper voltage, or pump efficiently to the desired voltage. FIG. 6 shows typical circuitry for use in a voltage pump design. The circuitry includes two transistors 400 having the short channel length of the present invention and a capacitor 610. Transistors 400 are connected in a diode fashion and placed in series with one another. Capacitor 610 is coupled between the input to the series of transistors 400 and a charging node 620. Typically, an input pulse is introduced at charging node 620. Gradually, with each succeeding pulse, a high voltage node 630 is "pumped" to a desired high voltage. Therefore, transistors 400 are subject to the stress of a high voltage at high voltage node 630, and should be able to tolerate the stress.

Figure 7:
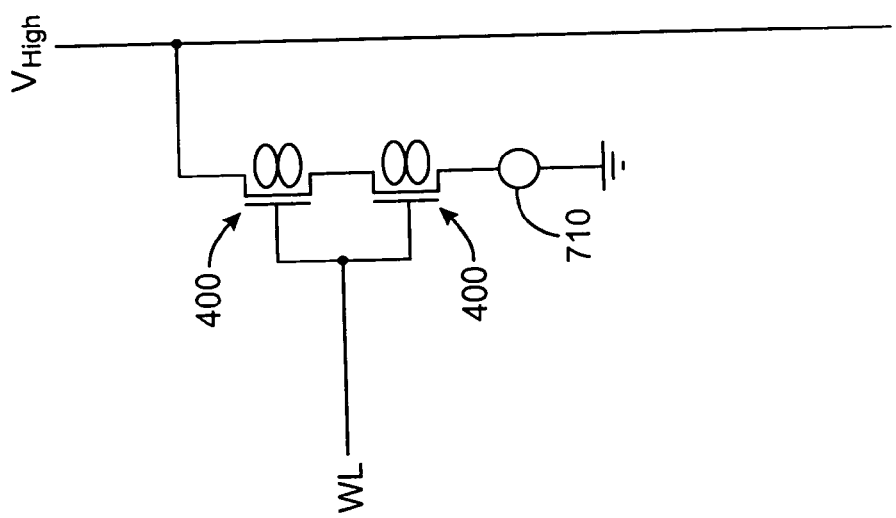
FIG. 7 is a diagram of circuitry for use in a memory using transistors of the present invention.

Another use for transistor 400 is in memory cell design. When programming a memory cell, a word line WL is selected, allowing $V_{high}$ to pass to a memory cell element. Leakage current is undesirable in the design of memory cells. FIG. 7 shows a diagram of a memory cell design using two transistors 400 of the present invention. Transistors 400 are connected in series between $V_{high}$ and a memory cell element 710. Transistors 400 are commonly selected with WL. When WL is asserted, transistors 400 pass the high voltage to memory cell element 710.

Many other uses in integrated circuits for high voltage transistors may be readily envisioned by one of skill in the art. The above examples illustrate the use of two transistors 400 in series. However, any number of transistors 400 may be strung together. The above examples are given by way of example only, and not to imply any particular limitation.

Figure 8:
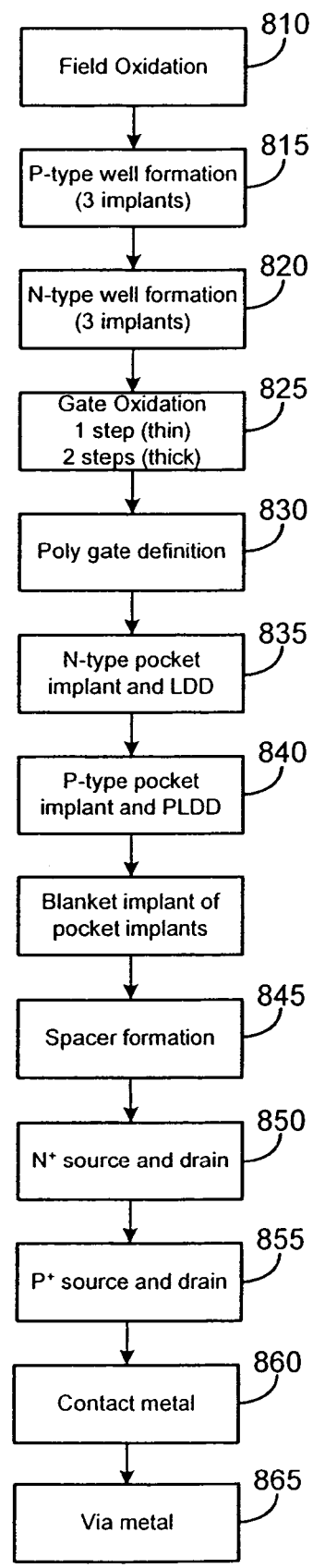
FIG. 8 is a flow diagram of a technique for making a device of the present invention.

FIG. 8 is a flow diagram showing a technique for fabricating transistors of the present invention. Although a specific embodiment is shown, many of the steps can be substituted or combined with other fabrication techniques that are now known or may be developed in the future without departing from the spirit and scope of the present invention.

In step 810, isolation regions 150 are formed in the substrate. One purpose of isolation regions 150 is to electrically isolate individual devices from other devices sharing the same substrate. For example, if an NMOS transistor and a PMOS transistor are adjacent to each other, an isolation region may be formed between them to isolate one transistor from the other. Conductive layers are later formed to make desired electrical connections. Isolation regions 150 may be formed, for example, by field oxidation, Shallow Trench Isolation (STI), or Local Oxidation of Silicon (LOCOS), or other techniques.

In step 815, p-type wells 140, field implants 120, and enhancement implants 130 are formed. In the specific embodiment, the three types of implants may be done a common p-well mask. Of course, all three implants are not necessary for all types of devices. For example, some native transistors do not have enhancement implant 130. Also, an NMOS transistor in a p-type substrate may not need a p-type well. Using a single p-well mask, by varying the energy levels and dopants, any of the three elements are formed. Many different techniques may be used to do the actual implantation. For example, the p-well implant may be done using retrograde well implantation.

In step 820, the previous step is repeated with an n-well mask for formation of n-type wells. An n-well mask is used in the formation of the n-type wells 140, field implants 120, and enhancement implants 130 for PMOS type devices. Well 140, field implant 120, and enhancement implant 130 may all be formed using the n-well mask.

After formation of the wells, a gate oxidation (not shown) is formed in step 825. The gate oxidation may be formed in one process step for a thin oxidation and two steps for a thick oxidation. After the gate oxidation is formed, in step 830, a polysilicon layer is deposited and polysilicon gate region 110 is etched above the oxidation layer.

In step 835, n-type pocket implants 310 are formed for the PMOS devices. Pocket implants 310 may be formed by implanting ions into the substrate using gate region 110 as a mask. The implantation is preferably done at an angle. The implantation is laterally diffused to optimize the reverse short channel effect of pocket implants 310. It is desirable that the maximum $V_t$ be provided for the channel length of the process being designed. Phosphorus, arsenic, or other n-type dopants may be used as the dopant for forming n-type pocket implants 310.

Also in step 835, the first implant of source/drain regions are implanted may be completed. A light doping of p-type material is placed in the substrate using gate region 110 as a guide. This is the first step in a procedure known as "lightly doped drain" (LDD) processing. LDD processing is well-known, and the details of this procedure will be understood by one of skill in the art. Though the specific embodiment uses LDD processing, other techniques may also be used that do not use a multi-step source/drain implanting process. In such cases, this portion of step 835 may be unnecessary.

In step 840, p-type pocket implants 310 are formed for the NMOS devices. These are formed using gate region 110 as a guide and implanting pocket implants 310 with a dopant. The implantation is preferably done at an angle and laterally diffused to optimize the reverse short channel effect of the transistor. The dopant may be, for example, boron. In the specific embodiment, an additional blanket boron implant (with a preferred dose in the range of $10^{11}$ cm$^{-2}$) is used to increase the channel doping of the native transistor. This provides a greater margin of punch-through immunity. The impact of this blanket boron doping on the p-channel transistors can be mitigated by slightly increasing the doping concentration of the n-well in step 820. Such a technique will allow additional margin for transistor punch-through immunity. The first implant for LDD processing in the n-type devices is also accomplished in this step.

In step 845, spacers (not shown) are placed next to the gate. These spacers may be used to mask off a portion of the first drain implant. Then in steps 850 and 855, the n-type and the p-type source/drain regions 105 are respectively formed with the second implant of the LDD process, using the gate with the spacers of step 845 as a guide.

Finally, in step 860, the contact metal layer is formed, followed by step 865 in which the via metal layer is formed. These steps are well known to those of skill in the art.

The specific embodiment described above is given as an example only. It will be recognized by one of skill in the art that many of the steps may be substituted with currently available or yet to be determined techniques without departing from the scope and spirit of the present invention. The claims are intended to be limited only by the attached claims.

What is claimed is:

1. A method of fabricating a transistor in an integrated circuit device comprising:
    providing a semiconductor substrate;
    implanting a field implant;
    implanting a well implant;
    implanting an enhancement implant;
    forming a gate oxide on the semiconductor substrate;
    forming a gate on the gate oxide;
    implanting a first pocket implant into the semiconductor substrate from a first side of the gate; and
    implanting a second pocket implant into the semiconductor substrate from a second side of the gate; and
    diffusing the first pocket implant and the second pocket implant laterally in the semiconductor substrate to form a non-uniform dopant concentration throughout a channel region, the non-uniform dopant concentration is configured to increase a punch-through voltage immunity threshold, and
    wherein the first pocket implant and the second pocket implant are in contact at about the center of the channel region.

2. The method of claim 1 wherein the first pocket implant and the second pocket implant are implanted at an angle.

3. The method of claim 1 wherein the first pocket implant and the second pocket implant are implanted using the gate as a mask.

4. The method of claim 1 wherein the diffusing comprises a non-uniform diffusion configured to optimize a reverse short channel effect of the transistor.

5. The method of claim 1 further comprising forming a source on the first side of the gate and a drain on the second side of the gate, wherein the source and drain are doped at a first polarity and the first pocket implant and the second pocket implant are doped at a second polarity.

6. The method of claim 5 wherein the first polarity is different than the second polarity.

7. A method of fabricating a transistor in an integrated circuit device comprising:
    providing a semiconductor substrate;
    forming a gate oxide on the semiconductor substrate;
    forming a gate on the gate oxide;
    implanting a first pocket implant and a second pocket implant into the semiconductor substrate using the gate as a mask; and
    diffusing the first and second pocket implants laterally causing the first pocket implant to merge with the second pocket implant at about a center portion of a channel disposed therebetween, the first and second pocket implants being diffused non-uniformly across the channel to adjust the punch-though voltage immunity.

8. The method of claim 7 wherein the diffusing comprises providing a non-uniform diffusion to optimize a reverse short channel effect of the transistor.

9. The method of claim 7 further comprising implanting an enhancement implant in the semiconductor substrate.

10. A method of fabricating a transistor in an integrated circuit device comprising:
    providing a semiconductor substrate having a surface;
    forming a gate oxide on the semiconductor substrate surface;
    forming a gate on the gate oxide;
    implanting a first pocket implant into the semiconductor substrate from a first side of the gate at an angle;
    implanting a second pocket implant into the semiconductor substrate from a second side of the gate at an angle; and
    diffusing the first and second pocket implants laterally causing the first pocket implant to merge with the second pocket implant; wherein the first and second pocket implants are diffused non-uniformly across a channel region formed therebetween, and wherein the non-uniform diffusion is configured to increase the punch-through voltage threshold.

11. The method of claim 10 wherein the first pocket implant and the second pocket implant are implanted using the gate as a mask.

12. A method of fabricating a transistor in an integrated circuit device comprising:
    providing a semiconductor substrate having a surface;
    forming a gate oxide on the semiconductor substrate surface;
    forming a gate on the gate oxide;
    implanting a first pocket implant into the semiconductor substrate from a first side of the gate at an angle;
    implanting a second pocket implant into the semiconductor substrate from a second side of the gate at an angle; and
    diffusing the first and second pocket implants laterally; wherein the first and second pocket implants are diffused non-uniformly across a channel region formed therebetween, and wherein the non-uniform diffusion is configured to increase a threshold voltage of the transistor.

13. The method of claim 12 wherein the diffusing comprises providing a non-uniform diffusion to about maximize the threshold voltage of the transistor relative to the length of the channel region.

14. The method of claim 12 further comprising implanting an enhancement implant in the semiconductor substrate.

15. The method of claim 1 wherein the channel region comprises a boron dopant configured to increase the punch-though voltage immunity.

16. The method of claim 1 wherein the diffusing comprises maximizing the punch-through voltage immunity by adjusting the lateral diffusement of the first pocket implant and the second pocket implant relative to the channel region length such that a maximum threshold voltage is obtained.

17. The method of claim 1 wherein the first pocket implant comprises an n-type of material.

18. The method of claim 17 wherein the first pocket implant comprises phosphorus, arsenic, and combinations thereof.

19. The method of claim 1 wherein the second pocket implant comprises an n-type of material.

20. The method of claim 19 wherein the second pocket implant comprises phosphorus, arsenic, and combinations thereof.

* * * * *